United States Patent
Orosel et al.

(10) Patent No.: US 12,232,422 B2
(45) Date of Patent: Feb. 18, 2025

(54) PIEZOELECTRIC MULTILAYER COMPONENT AND METHOD FOR PRODUCING A PIEZOELECTRIC MULTILAYER COMPONENT

(71) Applicant: TDK Electronics AG, Munich (DE)

(72) Inventors: Denis Orosel, Deutschlandsberg (AT); Yongli Wang, Frauental (AT)

(73) Assignee: TDK Electronics AG, Munich (DE)

( * ) Notice: Subject to any disclaimer, the term of this patent is extended or adjusted under 35 U.S.C. 154(b) by 766 days.

(21) Appl. No.: 17/272,063

(22) PCT Filed: Oct. 1, 2019

(86) PCT No.: PCT/EP2019/076638
§ 371 (c)(1),
(2) Date: Feb. 26, 2021

(87) PCT Pub. No.: WO2020/074329
PCT Pub. Date: Apr. 16, 2020

(65) Prior Publication Data
US 2021/0296564 A1    Sep. 23, 2021

(30) Foreign Application Priority Data
Oct. 12, 2018   (DE) .................. 10 2018 125 341.9

(51) Int. Cl.
*H01L 41/18*     (2006.01)
*H10N 30/097*    (2023.01)
(Continued)

(52) U.S. Cl.
CPC .......... *H10N 30/50* (2023.02); *H10N 30/097* (2023.02); *H10N 30/40* (2023.02); *H10N 30/8542* (2023.02)

(58) Field of Classification Search
CPC .................. H10N 30/8542; H10N 30/40
(Continued)

(56) References Cited

U.S. PATENT DOCUMENTS 6,884,364 B2   4/2005   Sato et al.
9,570,669 B2   2/2017   Glazunov et al.
(Continued)

FOREIGN PATENT DOCUMENTS

DE   102006057691 A1   6/2008
DE   102011112008 A1   2/2013
(Continued)

OTHER PUBLICATIONS

M. Guo, et al., "A Rosen-type piezoelectric transformer employing lead-free K0.5Na0.5NBO3 ceramics," Journal of Material Science, Oct. 31, 2007, 6 pages.

(Continued)

*Primary Examiner* — Derek J Rosenau
(74) *Attorney, Agent, or Firm* — Slater Matsil, LLP

(57) ABSTRACT

In an embodiment a piezoelectric multilayer component includes a ceramic main body comprising a ceramic material, wherein a main component of the ceramic material has the general empirical formula $(K_xNa_{1-x})NbO_3$, where $0 \le x \le 1$, wherein the ceramic material comprises at least two additives selected from a number of compounds respectively comprising at least one metal, wherein a metal of a first additive comprises at least K, Nb, Cu, Mn or Ta, and wherein a metal of a second additive comprises K, Nb or Ta.

20 Claims, 2 Drawing Sheets

(51) Int. Cl.
*H10N 30/40* (2023.01)
*H10N 30/50* (2023.01)
*H10N 30/853* (2023.01)

(58) Field of Classification Search
USPC .................. 310/358; 252/62.9 R, 62.9 PZ
See application file for complete search history.

(56) References Cited

U.S. PATENT DOCUMENTS

| | | | |
|---|---|---|---|
| 10,827,599 | B2 | 11/2020 | Doellgast et al. |
| 2004/0174098 | A1* | 9/2004 | Hsu .................. H10N 30/40 |
| | | | 310/366 |
| 2006/0202152 | A1 | 9/2006 | Tezumi et al. |
| 2009/0236556 | A1 | 9/2009 | Tanaka et al. |
| 2009/0243439 | A1 | 10/2009 | Furukawa et al. |
| 2010/0102679 | A1* | 4/2010 | Kawada ............... H10N 30/877 |
| | | | 310/365 |
| 2018/0175277 | A1 | 6/2018 | Kitada et al. |

FOREIGN PATENT DOCUMENTS

| | | |
|---|---|---|
| DE | 102014110405 A1 | 1/2016 |
| DE | 102017211348 B3 | 9/2018 |

OTHER PUBLICATIONS

Lin, D. et al., "Lead-free piezoelectric ceramic (K0.5Na0.5)NbO3 with MnO2 and K5.4Cu1.3Ta10O29 doping for piezoelectric transformer application" Smart Materials and Structures, Mar. 20, 2008, 7 pages.

* cited by examiner

PIEZOELECTRIC MULTILAYER COMPONENT AND METHOD FOR PRODUCING A PIEZOELECTRIC MULTILAYER COMPONENT

This patent application is a national phase filing under section 371 of PCT/EP2019/076638, filed Oct. 1, 2019, which claims the priority of German patent application 102018125341.9, filed Oct. 12, 2018, each of which is incorporated herein by reference in its entirety.

TECHNICAL FIELD

The invention relates to a piezoelectric multilayer component comprising a ceramic main body which comprises a ceramic material as main constituent. The invention further relates to a process for the production of a piezoelectric multilayer component.

BACKGROUND

Piezoelectric multilayer components are widely used components for a wide variety of technical applications. Piezoelectric multilayer components are therefore used, for example, as actuators, resonators, sensors and transformers. In particular, piezoelectric transformers can be used in atmospheric pressure plasma generators.

Piezoelectric multilayer components conventionally comprise a ceramic main body which comprises a lead-containing piezo-electric ceramic material. Patent Application No. DE 10 2006 057 691 A1 therefore discloses a piezoelectric multilayer component which comprises a ceramic main body that comprises a ceramic material based on lead zirconate titanate. The lead content of the lead-containing piezoelectric ceramic material has adverse effects on the environment and on human health.

SUMMARY

Embodiments provide a piezoelectric multilayer component which comprises a ceramic main body, where a ceramic material that is present in the ceramic main body has less adverse effects on the environment and on human health. Further embodiments provide a process for the production of the piezoelectric multilayer component.

A piezoelectric multilayer component is provided which comprises a ceramic main body. The ceramic main body comprises a ceramic material, where the main component of the ceramic material has the general empirical formula $(K_xNa_{1-x})NbO_3$ and $0 \leq x \leq 1$, and where the ceramic material comprises at least two additives selected from a number of compounds respectively comprising at least one metal, which is selected from a number of metals comprising at least K, Nb, Cu, Mn, Ta.

In other words, the ceramic material comprises $(K_xNa_{1-x})NbO_3$ as main component, where: $0 \leq x \leq 1$. The ceramic material comprises, in addition to the main component, at least two further compounds as additives. The individual compounds added as additives to the main component here respectively comprise one or more metals selected from a number of metals comprising at least K, Nb, Cu, Mn, Ta. The quantities of additives added to the main component are based, for the respective additive, on 100 mol % of the main component.

Further provided is a process for the production of a piezoelectric multilayer component which comprises a ceramic main body that comprises a ceramic material, where the process comprises a first calcination step and a second calcination step.

Further provided is another process for the production of a piezoelectric multilayer component which comprises a ceramic main body that comprises a ceramic material, where starting materials for the production of the ceramic material are processed in water.

The expression "starting materials" comprises raw materials and additives that are needed for the production of the ceramic material. Raw materials are substances needed for the production of a main component of the ceramic material. The use of water as solvent and dispersion medium, instead of organic solvents such as ethanol, permits realization of the production of the ceramic material in a manner that protects the environment and saves costs.

The abovementioned processes can be integrated into conventional processes for the production of piezoelectric multilayer components. This type of process can comprise the following steps provision of raw materials for the production of a main component of a ceramic material, provision of additives, mixing, grinding and calcination of the raw materials, in order to obtain the main component of the ceramic material, addition of the additives to the main component, in order to obtain the ceramic material, processing of the ceramic material to give a ceramic green film, printing of the ceramic green film with internal electrodes, stacking of a large number of printed ceramic green films, in order to form a film stack, pressing of the film stack, in order to form a green body, conduct of a sinter step with the green body, in order to obtain a ceramic main body, conduct of a tempering step with the ceramic main body, and application of external contacts to the tempered ceramic main body.

The abovementioned processes are particularly suitable for the production of piezoelectric multilayer components which comprise a ceramic main body, where the ceramic main body comprises a lead-free piezoelectric ceramic material.

Metal oxides can preferably be used as additives. Metal-containing compounds which can be converted into metal oxides can particularly preferably be used as additives. These metal-containing compounds are converted to the corresponding metal oxides during the sinter step. The metal-containing compounds can be selected from a number comprising at least metal carbonates and metal acetates and mixtures thereof.

The ceramic main body of the piezoelectric multilayer component can moreover have a larger number of internal electrodes. The internal electrodes can consist of a material selected from a number comprising at least Ag, Pd, Pt, Cu, Ni and all of the alloys made of at least two of the metals mentioned. The internal electrodes preferably consist of Cu, because this has high conductivity and is considerably less expensive than, for example, Ag or Pt.

In the process for the production of a piezoelectric component it is moreover possible to carry out the second calcination step at a maximal temperature which differs from a maximal temperature at which the first calcination step is carried out. The first calcination step can preferably be carried out at a maximal temperature selected from a range of 700° C. to 800° C. The second calcination step can preferably be carried out at a maximal temperature selected from a range of 800° C. to 900° C. In a particularly preferred possibility, the first calcination step is carried out at 750° C. and the second calcination step is carried out at 880° C.

Conduct of the first and of the second calcination step at different maximal temperatures permits reproducible production of the main component of the ceramic material with high phase purity. This is advantageous in particular in industrial mass production.

The second calcination step can moreover be carried out with a retention time equal to the retention time of the first calcination step. The retention time used for the first and the second calcination step can be selected from a range of two hours to six hours. The retention time can preferably be selected from a range of three hours to five hours. The first and the second calcination step can particularly preferably be carried out with a retention time of respectively four hours.

The meaning of "retention time" here and hereinafter is a time during which, during a thermal process, a material exposed to said process is exposed to the maximal temperature provided for the thermal process. A thermal process can by way of example be a calcination step, a sinter step or a tempering step.

In other words, in relation to the abovementioned calcination steps, if by way of example a maximal temperature of 750° C. is provided for the first calcination step and by way of example a maximal temperature of 880° C. is provided for the second calcination step, and the retention time is four hours, the raw materials are respectively calcined for the duration of four hours at 750° C. and, respectively, 880° C.

The ceramic green films can moreover be stored under different storage conditions, in order to influence the quality of the sintered component. In particular, the ceramic green films can be stored under particular humidity conditions.

The sinter step can moreover be carried out at a maximal temperature selected from a range of 1000° C. to 1080° C. A maximal temperature of 1050° C. can preferably be selected for the sinter step. A maximal temperature of 1050° C. is in particular preferred in the case of internal electrodes made of copper, because this maximal temperature is sufficiently high to sinter the green body without concomitant melting of the internal electrodes.

The retention time of the sinter step can moreover be selected from a range of 30 minutes to 120 minutes. The retention time can preferably be selected from a range of 30 minutes to 60 minutes. A retention time of 30 minutes can particularly preferably be selected.

The sinter step can be carried out in an inert atmosphere. The sinter step can preferably be carried out in a nitrogen atmosphere or in a forming gas atmosphere. Conduct of the sinter step in an inert atmosphere is particularly advantageous when copper is used as material for the internal electrodes. The inert atmosphere avoids oxidation of the copper, and the electrical properties of the copper are retained.

A tempering step can moreover be carried out after the sinter step. The tempering step can preferably be carried out at a maximal temperature selected from a range of 800° C. to 900° C. The tempering step can particularly preferably be carried out at a maximal temperature selected from a range of 800° C. to 850° C.

The expression "tempering step" here and hereinafter means a thermal process which is carried out after a sinter step. The maximal temperature for the tempering step is moreover selected in a manner such that said temperature is lower than a maximal temperature selected for the sinter step.

A retention time selected for the tempering step can moreover be in a range of one hour to two hours. A retention time of two hours can preferably be selected for the tempering step. The tempering step can be carried out in air or in an atmosphere with an oxygen partial pressure of $2\times10^{-1}$ to $2\times10^{-6}$ bar.

The tempering step is in particular advantageous when the sinter step has been carried out in an inert atmosphere. Sintering of the ceramic material in an inert atmosphere induces oxygen vacancies in the ceramic material. These oxygen vacancies have an adverse effect on the properties of the ceramic material and thus on the entire piezoelectric multilayer component. In order to remove the oxygen vacancies and thus to avoid adverse effects on the piezoelectric multilayer component, the tempering step is carried out in an oxygen-containing atmosphere. The abovementioned ranges for the maximal temperature and retention time of the tempering step are selected here in a manner that achieves high mobility of the atoms and ions present in the ceramic material while avoiding significant concomitant deformation of the multilayer component and/or oxidation of the internal electrodes.

It is moreover noted that the piezoelectric multilayer component described has not only the smaller adverse effect on the environment and on human health but also further advantages in process technology in comparison with lead-containing piezoelectric multilayer components. The geometry of the ceramic main body of the multilayer component described is therefore also retained after conduct of the thermal processes.

In other words, the ceramic layers of the ceramic main body undergo no significant deformation during the conduct of a thermal process. This is true independently of any selected atmosphere. There is therefore no requirement for possible steps involving downstream operations, and the production of the piezoelectric multilayer component described can therefore be realized in an inexpensive and simple manner.

The piezoelectric multilayer component can moreover have a coating for protection from adverse environmental effects. This coating can comprise a material selected from a number comprising at least parylenes and silicones.

The piezoelectric multilayer component is suitable for a use in an atmospheric pressure plasma generator. An atmospheric pressure plasma generator is a plasma generator which generates a cold plasma under pressure conditions usually prevailing on the Earth's surface. The expression "cold plasma" means a plasma whose temperature is 50° C. or below.

BRIEF DESCRIPTION OF THE DRAWINGS

A ceramic main body, a ceramic green film and a piezoelectric multilayer component are described below with reference to diagrammatic drawings.

Elements that are identical or similar, or that are visually identical, have identical reference signs in the figures. The figures, and the size relationships therein, are not to scale.

DETAILED DESCRIPTION OF ILLUSTRATIVE EMBODIMENTS

Figure 1:
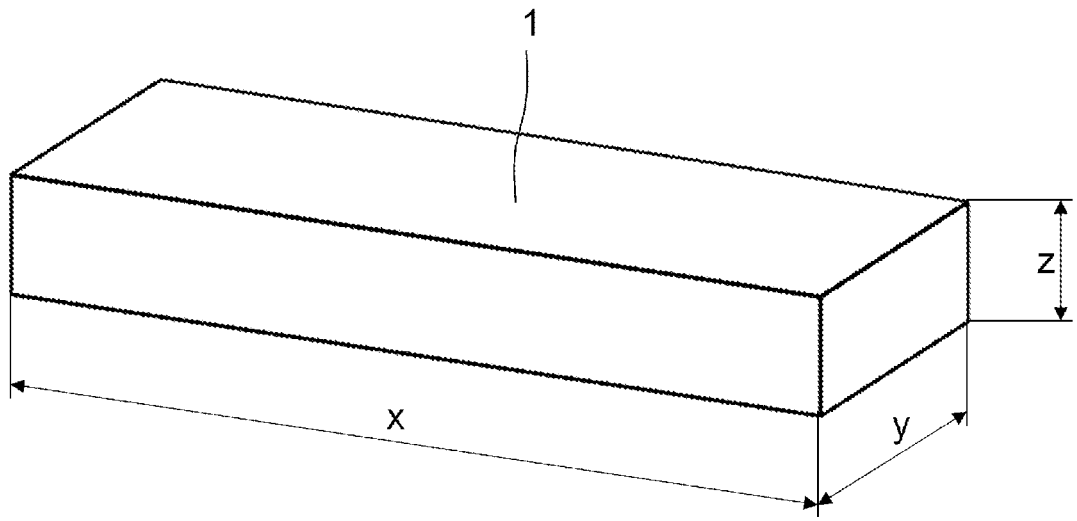
FIG. 1 shows a ceramic main body.

FIG. 1 shows a ceramic main body 1 of a piezoelectric multilayer component. The ceramic main body 1 has a longitudinal side x, which is longer than a first perpendicular side y and a second perpendicular side z. The first perpendicular side y is moreover longer than the second perpendicular side z. The ceramic main body 1 comprises a ceramic material that comprises a main component with the general empirical formula $(Na_{0.5}K_{0.5})NbO_3$. $K_{5.4}Cu_{1.3}Ta_{10}Nb_{29}$ and $MnCO_3$ were additionally added as additives to the main component.

Raw materials, for example $K_2CO_3$, $Na_2CO_3$ and $Nb_2O_5$, are mixed and ground for the production of the main component. The raw materials are then calcined in a first calcination step at 750° C. and with a retention time of four hours. The first calcination step is followed by a second calcination step, which is carried out at 880° C. and with a retention time of four hours. 0.38 mol % of $K_{5.4}Cu_{1.3}Ta_{10}Nb_{29}$ and 0.25 mol % of $MnCO_3$, based on 100 mol % of $(Na_{0.5}K_{0.5})NbO_3$, are then added to the main component in order to obtain the ceramic material.

For the production of the ceramic main body 1, ceramic green films are produced from the ceramic material and are printed with internal electrodes made of copper (not depicted). A large number of printed ceramic green films are then stacked on one another and pressed, in order to form a green body. The green body is used in a next step, at 1050° C. and with a retention time selected from a range of 30 min to 120 min, to carry out a sinter step, in order to obtain a ceramic main body 1. The sinter step is carried out here in an inert atmosphere, for example a nitrogen atmosphere. After the sinter step, a tempering step is carried out with the ceramic main body 1. The tempering step is carried out in air at a maximal temperature between 800° C. and 900° C. and with a retention time between one hour and two hours.

After the tempering step, external contacts (not depicted), for example made of Ag, are applied on the ceramic main body 1, in order to provide contact to the internal electrodes (not depicted).

Figure 2:
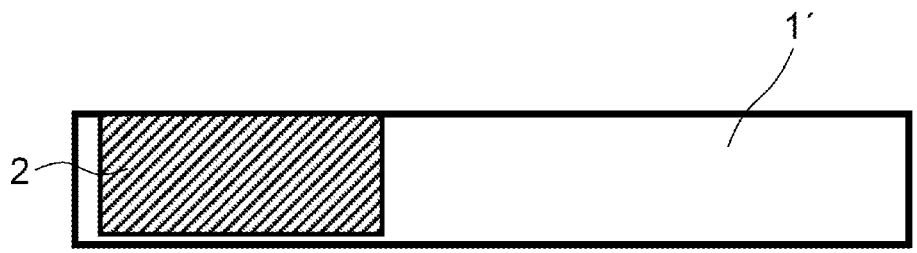
FIG. 2 shows a plan view of a ceramic green film.

FIG. 2 shows a plan view of a ceramic green film 1'. The ceramic green film 1' has been to some extent printed with an internal electrode 2 made of copper. The green film 1' depicted can be used to construct a ceramic main body, similar to that described in FIG. 1.

Figure 3A:
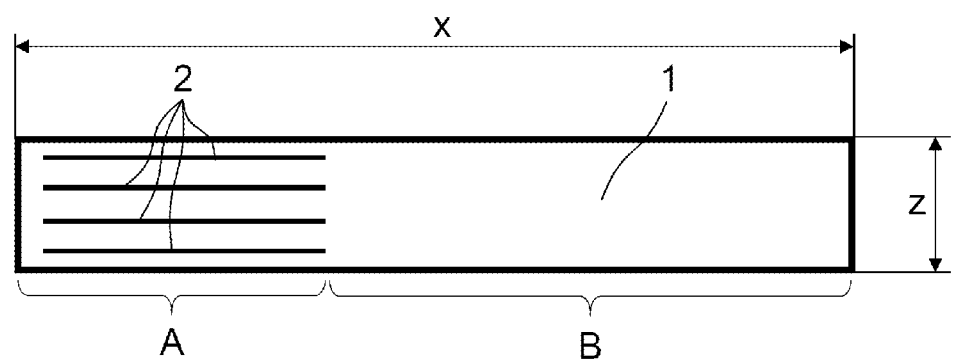
FIG. 3a shows a longitudinal section of a piezoelectric multilayer component.

FIG. 3a shows a longitudinal section of a piezoelectric multilayer component. The piezoelectric multilayer component comprises a ceramic green body 1, similar to that described in FIG. 1. The longitudinal section runs in a plane through the ceramic main body 1, said plane being parallel to an area bounded by the longitudinal side x and the second perpendicular side z. The piezoelectric multilayer component has a region with internal electrodes 2 and a region without internal electrodes 2. The region having the internal electrodes 2 is termed input side A, and the region having no internal electrodes 2 is termed output side B. The piezoelectric multilayer component is configured as a piezotransformer.

Figure 3B:
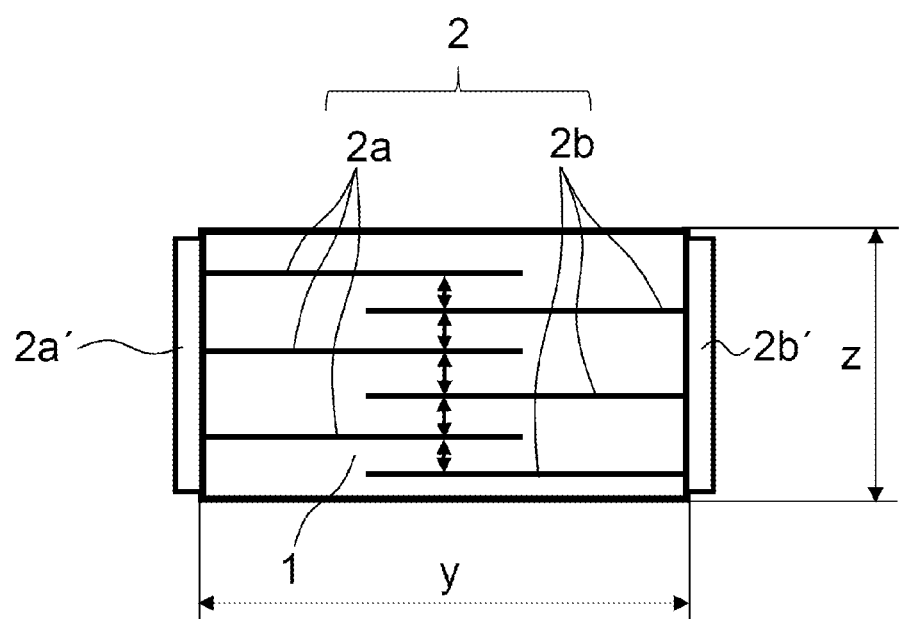
FIG. 3b shows a cross section of a piezoelectric multilayer component.

FIG. 3b shows a cross section through a multilayer component similar to that described in FIG. 3a. The cross section runs through the ceramic main body 1 in a plane that is parallel to an area bounded by the first perpendicular side y and by the second perpendicular side z. The cross section runs through the input side A of the multilayer component, said side having the internal electrodes 2. The internal electrodes 2 can be divided into first internal electrodes 2a and second internal electrodes 2b. The first internal electrodes 2a have contact to a first external contact 2a', and the second internal electrodes 2b have contact to a second external contact 2b'. The first external contact 2a' and the second external contact 2b' have opposite polarity.

Application of a voltage to the first external contact 2a' and to the second external contact 2b' induces, by means of the first internal electrodes 2a and the second internal electrodes 2b, an electromagnetic field in the input side A of the ceramic main body 1. By virtue of an inverse piezoelectric effect, this results in a length change of the input side A of the ceramic main body 1 along the induced electromagnetic field. Possible directions of length changes are depicted in FIG. 3b by the arrows.

Application of an alternating voltage to the first external contact 2a' and to the second external contact 2b' produces an alternating length change in the input side A of the ceramic main body 1. In other words, the input side A of the ceramic main body 1 begins to vibrate. This vibration is transferred from the input side A of the ceramic main body 1 to the output side B of the ceramic main body 1.

By virtue of a piezoelectric effect, the alternating length change of the output side B produces an alternating voltage. This alternating voltage can be extracted by means of third external contacts (not depicted) at the output side B of the ceramic main body 1. The position of the third external electrodes (not depicted) at the output side B of the ceramic main body 1 can be such that the alternating voltage extracted at the output side B is several times higher than the voltage applied at the input side A.

The voltages generated at the output side B of the ceramic main body 1 can be sufficiently large to produce spontaneous electrical discharges. The component described here is therefore particularly suitable for a use in an atmospheric pressure plasma generator.

Although the figures describe exclusively a piezoelectric transformer, the present invention is not restricted to same. Configurations as, for example, sensors or resonators are also possible.

What is claimed is:

1. A piezoelectric multilayer component comprising:
    a ceramic main body consisting of a ceramic material consisting of a main component and two or more additives,
    wherein the main component has the general empirical formula $(KxNa1-x)NbO3$, where $0 \leq x \leq 1$, wherein the two or more additives are selected from a number of compounds respectively comprising one metal selected from K, Nb, Cu, Mn or Ta.

2. The piezoelectric multilayer component according to claim 1, wherein the ceramic main body has a large number of internal electrodes.

3. The piezoelectric multilayer component according to claim 2, wherein the internal electrodes comprise at least Ag, Pd, Pt, Cu or Ni, or an alloy comprising at least two of the metals mentioned.

4. An atmospheric pressure plasma generator comprising:
    the piezoelectric multilayer component according to claim 1,
    wherein the pressure plasma generator is configured to generate a cold plasma.

5. A method for producing the piezoelectric multilayer component according to claim 1, the method comprising:
    performing a first calcination step; and
    performing a second calcination step.

6. The method according to claim 5, wherein the second calcination step is performed at a maximal temperature which differs from a maximal temperature at which the first calcination step is performed.

7. The method according to claim 6, wherein the first calcination step is performed at the maximal temperature selected from a range of 700° C. to 800° C., and wherein the second calcination step is performed at the maximal temperature selected from a range of 800° C. to 900° C.

8. The method according to claim 5, wherein a retention time of the second calcination step is equal to a retention time of the first calcination step.

9. The method according to claim 8, wherein the first and second calcination steps respectively are performed with a retention time selected from a range of two hours to six hours.

10. The method according to claim 5, further comprising performing a sinter step for which a maximal temperature selected is between 1000° C. and 1080° C. and a retention time selected is between 30 minutes and 120 minutes.

11. The method according to claim 10, wherein the sinter step is performed in an inert atmosphere.

12. The method according to claim 10, further comprising performing a tempering step after performing the sinter step.

13. The method according to claim 12, wherein the tempering step is performed at a maximal temperature selected between 800° C. and 900° C. and a retention time selected between one and two hours.

14. The method according to claim 12, wherein air or an atmosphere with an oxygen partial pressure of 2×10-1 to 2×10-6 is selected as atmosphere during performance of the tempering step.

15. A method for producing the piezoelectric multilayer component according to claim 1, the method comprising:
processing starting materials for producing the ceramic material in water.

16. The method according to claim 15, further comprising performing sintering with a maximal temperature selected between 1000° C. and 1080° C. and with a retention time selected between 30 minutes and 120 minutes.

17. The method according to claim 16, wherein sintering is performed in an inert atmosphere.

18. The method according to claim 16, further comprising performing tempering after performing sintering.

19. The method according to claim 18, wherein tempering is performed with a maximal temperature selected between 800° C. and 900° C. and with a retention time selected between one and two hours.

20. The method according to claim 18, wherein air or an atmosphere with an oxygen partial pressure of 2×10-1 to 2×10-6 is selected as atmosphere while performing tempering.

* * * * *